United States Patent
Chen (10) Patent No.: US 12,356,578 B2
(45) Date of Patent: Jul. 8, 2025

(54) ALUMINUM EXTRUDED SERVER SLIDE RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 117 days.

(21) Appl. No.: 18/536,255

(22) Filed: Dec. 12, 2023

(65) Prior Publication Data

US 2025/0194039 A1 Jun. 12, 2025

(51) Int. Cl.
| | |
|---|---|
| H05K 7/14 | (2006.01) |
| A47B 88/407 | (2017.01) |
| A47B 88/477 | (2017.01) |
| A47B 88/483 | (2017.01) |
| H05K 7/18 | (2006.01) |

(52) U.S. Cl.
CPC ......... *H05K 7/1489* (2013.01); *A47B 88/407* (2017.01); *A47B 88/477* (2017.01); *A47B 88/483* (2017.01); *H05K 7/183* (2013.01)

(58) Field of Classification Search
CPC .... H05K 7/1489; H05K 7/183; A47B 88/407; A47B 88/477; A47B 88/483
See application file for complete search history.

(56) References Cited

U.S. PATENT DOCUMENTS

| | | | | |
|---|---|---|---|---|
| 6,209,979 | B1 * | 4/2001 | Fall | H05K 7/1489 312/319.1 |
| 6,588,866 | B2 * | 7/2003 | Cheng | G11B 33/128 |
| 6,601,933 | B1 * | 8/2003 | Greenwald | A47B 88/49 312/334.46 |
| 7,481,504 | B2 * | 1/2009 | Chen | A47B 88/427 312/333 |
| 7,604,307 | B2 * | 10/2009 | Greenwald | A47B 88/49 312/334.46 |
| 8,528,999 | B2 * | 9/2013 | Chen | H05K 7/1489 312/334.45 |

(Continued)

FOREIGN PATENT DOCUMENTS

| | | | | | |
|---|---|---|---|---|---|
| CN | 102883578 | A | * | 1/2013 | H05K 7/1489 |
| CN | 110087427 | A | * | 8/2019 | H05K 7/1489 |

(Continued)

*Primary Examiner* — Hanh V Tran
(74) *Attorney, Agent, or Firm* — Fei-hung Yang (57) ABSTRACT

An aluminum extruded server slide rail includes an inner rail, a middle rail, an outer rail, a number of sliding assistance parts, and an elastic locking plate. The inner, middle, and outer rails are manufactured by aluminum extrusion, assembled to the sliding assistance parts and the elastic locking plate, and then installed in a server cabinet. The interior of the server cabinet has four vertical brackets, two sides of the server have a number of fixed columns, the rear section of the inner rail has a first operating hole and configured to be corresponsive to a pair of fixing holes, the front section of the middle rail has a second operating hole, two ends of the elastic locking plate have first and second locking parts for fixing the server onto the inner rail and making the inner rail and the middle rail to be connected with each other.

8 Claims, 7 Drawing Sheets

(56) References Cited

U.S. PATENT DOCUMENTS

| | | | | |
|---|---|---|---|---|
| 8,622,492 | B2* | 1/2014 | Chen | A47B 88/423 |
| | | | | 312/348.2 |
| 8,690,271 | B1* | 4/2014 | Chang | A47B 88/427 |
| | | | | 248/424 |
| 9,039,107 | B2* | 5/2015 | Judge | H05K 7/1489 |
| | | | | 312/333 |
| 9,198,323 | B1* | 11/2015 | Chen | F16C 29/04 |
| 9,247,814 | B2* | 2/2016 | Chen | A47B 88/493 |
| 9,382,943 | B2* | 7/2016 | Judge | F16C 29/048 |
| 9,572,277 | B2* | 2/2017 | Chen | H05K 7/183 |
| 9,670,956 | B2* | 6/2017 | Judge | F16C 29/04 |
| 11,246,410 | B2* | 2/2022 | Chen | A47B 88/443 |
| 12,251,016 | B2* | 3/2025 | Yao | A47B 88/493 |
| 12,268,301 | B2* | 4/2025 | Chen | A47B 88/447 |

FOREIGN PATENT DOCUMENTS

| | | | | |
|---|---|---|---|---|
| CN | 110392509 | A * | 10/2019 | H05K 5/0204 |
| JP | 3180814 | U * | 1/2013 | A47B 88/427 |

* cited by examiner

ALUMINUM EXTRUDED SERVER SLIDE RAIL

BACKGROUND OF THE DISCLOSURE

Technical Field

The present disclosure relates to a cabinet slide rail, more particularly relates to an aluminum extruded server slide rail, which can accurately control the thickness of the slide rail, lock a server on an inner rail, and form a linkage between the inner rail and an outer rail by means of an aluminum extrusion process, while taking into account the strength of use, the convenience of installation, and the convenience of operation.

Description of the Related Art

In general, the chasses for computers are installed horizontally like drawers one by one inside a cabinet with a rack vertically erected from each of the four corners of the cabinet, and each rack is provided with a plurality of fixing holes or screw hole at intervals on a surface of the rack, so the industrial computers are traditionally mounted on the cabinet by means of fixing blocks or fixing screws, etc. In recent years, a slide rail structure with the characteristics of stretching by pulling and retracting by stacking is mostly used for pushing the industrial computers into the cabinet, or optionally pulling the industrial computers outward from the cabinet for expansion, replacement, or inspection, which greatly improves the convenience of the subsequent maintenance.

However, since the cabinet and the server chassis are manufactured with the dimensions according to international standards, any obstacles encountered during assembling can only be improved by the use of auxiliary brackets or rails. The rail is positioned and installed in the cabinet through the brackets, so this kind of brackets will be equipped with a plurality of positioning columns corresponding to the plurality of fixed holes of the rack inside the cabinet to facilitate the disassembly and assembly. As a result, the structure and size of most of them will be limited. On the other hand, the slide rail structure is subject to the conventional system width (chassis width) of a specification of 438.0 mm, or 438.4 mm, etc., and thus the selection of slide rails must be based on the specification of the chassis width in order to achieve a successful installation. Assumed that it is necessary to have a chassis with a width falling within a range of 438.0~444.0 mm, but most of the existing server slide rails are made by bending or stamping a metal sheet, therefore during the manufacturing process, the metal plate even with good ductility will produce small discrepancies in size after being bent or stamped or processed by other processes. For the chassis width of 438.4 mm, the traditional production methods cannot control the dimensions so accurately, not mentioning that such a thickness will affect the strength of the use. In summary, due to the limitations of the existing bending, stamping or other processes and the material itself, the problems of how to control the dimensions more accurately and to install the server rail more easily become even more apparent.

In view of the description above, the present discloser based on years of experience in the related industry to conduct research and experiment, and finally developed an aluminum extruded server slide rail, which is mainly designed for the chassis width of 438.0 mm or 438.4 mm, etc. Through the use of aluminum extrusion process to accurately control the size during the manufacturing process and completely control the thickness of the internal components of the rail, as well as designing locking a bracket that can simultaneously lock the server to the inner rail and form a linkage between the inner and outer rails, not only taking into account the strength of use and the ease of installation, but also enhancing the convenience of operation.

SUMMARY OF THE DISCLOSURE

It is a primary objective of the present disclosure to provide an aluminum extruded server slide rail, which includes an inner rail, a middle rail, an outer rail, a plurality of sliding assistance parts and an elastic locking plate, wherein the inner rail, the middle rail and the outer rail are manufactured by an aluminum extrusion process, assembled, and then installed in a server cabinet, the rear section of the inner rail has a first operating hole configured to be corresponsive to one of the pairs of fixing holes, the front section of the middle rail has a second operating hole, two ends of the elastic locking plate have a first locking part and a second locking part respectively for mounting the server onto the inner rail and forming a linkage between the inner rail and the middle rail, so that the present disclosure can more accurately control the installation size to fit the chassis width of two specifications such as 438.0 mm or 438.4 mm and can provide a more convenient and quicker operation.

To achieve the aforementioned objective, the present disclosure discloses an aluminum extruded server slide rail installed in a server cabinet and connected to two sides of the server for a stretching or retracting operation, wherein the interior of the server cabinet is provided with four vertical brackets, and two sides of the server are provided with a plurality of fixed columns. Each aluminum extruded server slide rail includes: an inner rail, which is a long strip structure manufactured by an aluminum extrusion process and having a cross-sectional view in a c-shape, and its upper and lower edges are formed with a first groove, a planar area of the inner rail is provided with a plurality of fixing holes corresponding to the fixed columns respectively, a rear section of the plane of the inner rail is provided with a first operating hole configured to be corresponsive to one of the pairs of fixing holes; a middle rail, which is a long strip structure manufactured by an aluminum extrusion process and having a cross-sectional view in a c-shape, the interior of its upper and lower edges is formed with a second groove, the exterior of the upper and lower edges is formed with a third groove, the inner rail is spaced inside the middle rail, such that a first sliding assistance space is defined between each first groove and each second groove, the central part of the middle rail has a stock thickness greater than the stock thickness of the bilateral part, and the stock thickness of the central part cannot exceed two times of the stock thickness of the bilateral part, and the front section of a planar area of the middle rail is provided with a second operating hole; an outer rail, which is a long strip structure manufactured by an aluminum extrusion process and having a cross-sectional view in a c-shape, the interior of its upper and lower edges is formed with a fourth groove, the middle rail is spaced inside the outer rail, such that a second sliding assistance space is defined between each third groove and each fourth groove; a plurality of sliding assistance parts, disposed in the first sliding assistance space and the second sliding assistance space respectively, such that the inner rail can be slid and telescoped relative to the middle rail, and the middle rail can be slid and telescoped relative to the outer rail; and an elastic locking plate, with a central part fixed onto the inner rail, and two ends of the elastic locking plate are provided with a first locking part and a second locking part respectively, the first locking part is flatly installed and configured to be corresponsive to the first operating hole, such that the first locking part is locked at a position of the fixed columns that pass out from the pair of fixing holes on the sides of the first operating hole, so as to fix the server onto the inner rail, and the second locking part is tilted at a position corresponding to the second operating hole, and the second locking part is passed out from the second operating hole to form a linkage between the inner rail and the middle rail.

In an embodiment of the present disclosure, the fixing holes are configured in pairs and spaced from one another, and each pair of fixing holes is disposed at the front section, the middle section and the rear section of the inner rail respectively; each fixing hole is in an ∞ shape, having an end with a size greater than the size of a head end of any one of the fixed columns to form a release part, and another end with a size smaller than the size of the head end of any one of the fixed columns to form a fixed part, and the fixed part is disposed in a direction towards the outward pulling direction defined by the inner rail. In addition, during installation and operation, the server is pushed from the back to the front in the outward pulling direction defined by the inner rail in order to pass the fixed columns on the side into each release part and push at the fixed parts to form a fixation, and then an edge of the first locking part of the elastic locking plate is provided for stopping the head end part of the pair of fixed columns to lock the server to a position on the inner rail. When it is necessary to remove the server, a user puts a finger into the first operating hole and turns the first locking part of the elastic locking plate outward, and after the pair of fixed columns is released, the server is pushed in an opposite direction to pass the fixed columns through the release parts to allow the user to remove the server.

In another embodiment, the width between the two brackets is 450 mm, the width of the server is 438 mm, the remaining gap after deduction is 12 mm provided for installing the two aluminum extruded server slide rails, so that the thickness of each inner rail plus each middle rail on one side is 6 mm, the thickness of the inner rail is 1.2 mm, the stock thickness of the central part of the middle rail is 2.5 mm, and the stock thickness of the bilateral part is 1.5 mm; or the width between the two brackets is 450 mm, the width of the server is 438.4 mm, the remaining gap after deduction is 11.6 mm provided for installing the two aluminum extruded server slide rails, so that the thickness of each inner rail plus each middle rail on one side is 5.8 mm, the thickness of the inner rail is 1.2 mm, the stock thickness of the central part of the middle rail is 2.3 mm, and the stock thickness of the bilateral part is 1.3 mm.

It is noteworthy that the first locking part of the elastic locking plate of this disclosure is horizontally formed with a U-shaped notch, and its adjacent edge is provided with a reinforcement part, and a surface of the second locking part is provided with a pair of reinforcement ribs, and its adjacent edge is provided with a pressing part protruded from the adjacent edge, configured to be corresponsive to the second operating hole, and accommodated in the second operating hole.

DESCRIPTION OF THE PREFERRED EMBODIMENTS

The objectives, technical contents and features of this disclosure will become apparent in the following detailed description of the preferred embodiments with reference to the accompanying drawings.

With reference to FIGS. 1 to 4 and 5 to 7 for the schematic views of a preferred embodiment of the present disclosure viewing at different angles, the partial blowup view, the cross-sectional view after assembling, and the cross-sectional views showing the statuses of different operations of the present disclosure respectively, the present disclosure provides an aluminum extruded server slide rail 1 including an inner rail 11, a middle rail 12, an outer rail 13, a plurality of sliding assistance parts 14 and an elastic locking plate 15. After the aluminum extruded server slide rail 1 is installed in a server cabinet 2 and connected to two sides of the server 3, the aluminum extruded server slide rail 1 can be stretched or retracted, wherein the interior of the server cabinet 2 is provided with four vertical brackets 21, and two sides of the server 3 are provided with a plurality of fixed columns 31.

The inner rail 11 is a long strip structure manufactured by an aluminum extrusion process and having a cross-sectional view in a c-shape, and the upper and lower edges of the inner rail 11 are formed with a first groove 111, a planar area of the inner rail 11 is provided with a plurality of fixing holes 112 corresponding to the fixed columns 31, and the rear section of a planar area of the inner rail 11 is provided with a first operating hole 113 which is configured to be corresponsive to one of the pairs of fixing holes 112. It is noteworthy that the fixing holes 112 are configured in pairs and spaced from one another, each pair of fixing holes 112 is disposed at the front section, the middle section and the rear section of the inner rail 11, each fixing hole 112 is in an o shape, having an end with a size greater than the size of a head end of any one of the fixed columns 331 to form a release part 1121 and another end with a size smaller than the size of the head end of any one of the fixed columns 331 to form a fixed part 1122, and the fixed part 1122 is disposed in a direction towards the outward pulling direction defined by the inner rail 11.

The middle rail 12 is also a long strip structure manufactured by the aluminum extrusion process and having a cross-sectional view in a c-shape, and the interior of the upper and lower edges of the middle rail 12 is formed with a second groove 121, and the exterior of the upper and lower edges of the middle rail 12 is formed with a third groove 122, the inner rail 11 is spaced inside the middle rail 12, such that a first sliding assistance space 123 is defined between each first groove 111 and each second groove 121, the stock thickness of the central part of the middle rail 12 is greater than the stock thickness of the bilateral part, the stock thickness of the central part cannot exceed two times of the stock thickness of the bilateral part, and the front section of a planar area of the middle rail 12 is provided with a second operating hole 124.

The outer rail 13 is also a long strip structure manufactured by the aluminum extrusion process and having a cross-sectional view in a c-shape, the interior of the upper and lower edges of the outer rail 13 is formed with a fourth groove 131, and the middle rail 12 is spaced inside the outer rail 13, such that a second sliding assistance space 132 is defined between each third groove 122 and each fourth groove 131. The sliding assistance parts 14 are disposed in the first sliding assistance space 123 and the second sliding assistance space 132, such that the inner rail 11 can be slid and telescoped relative to the middle rail 12, and the middle rail 12 can be slid and telescoped relative to the outer rail 13.

Figure 1:
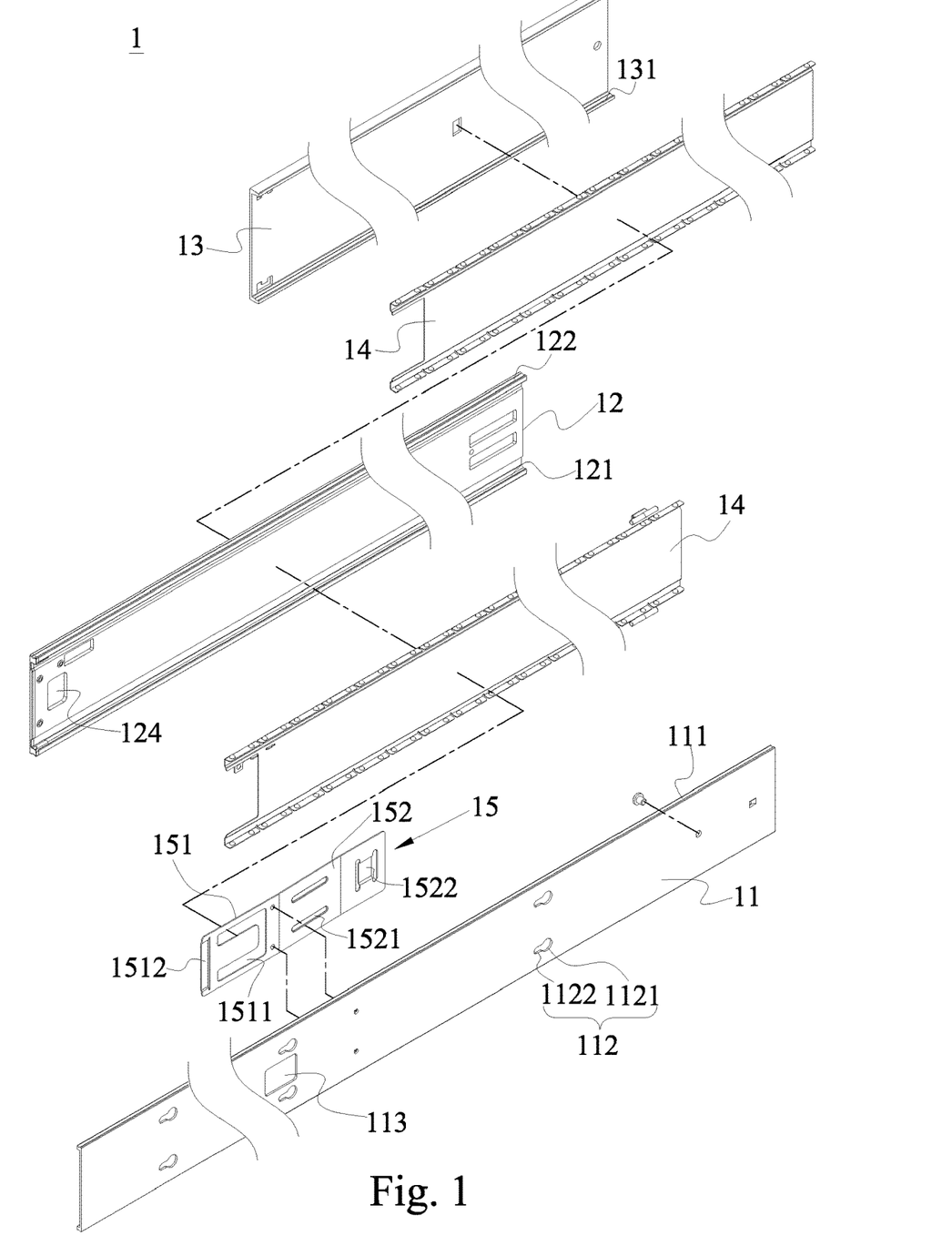
FIG. 1 is a first schematic view of the structure of a preferred embodiment of the present disclosure.
Figure 2:
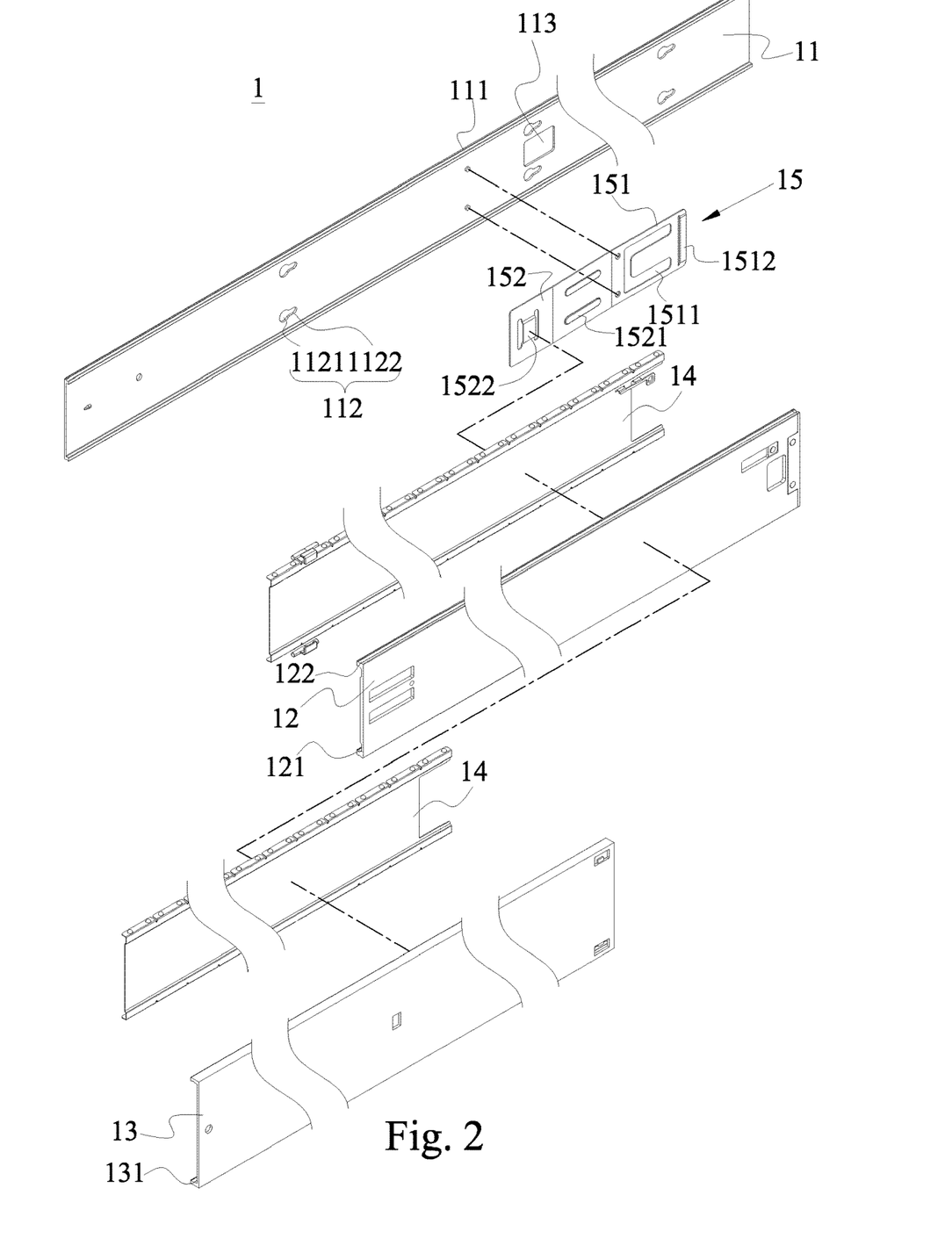
FIG. 2 is a second schematic view of the structure of a preferred embodiment of the present disclosure.
Figure 3:
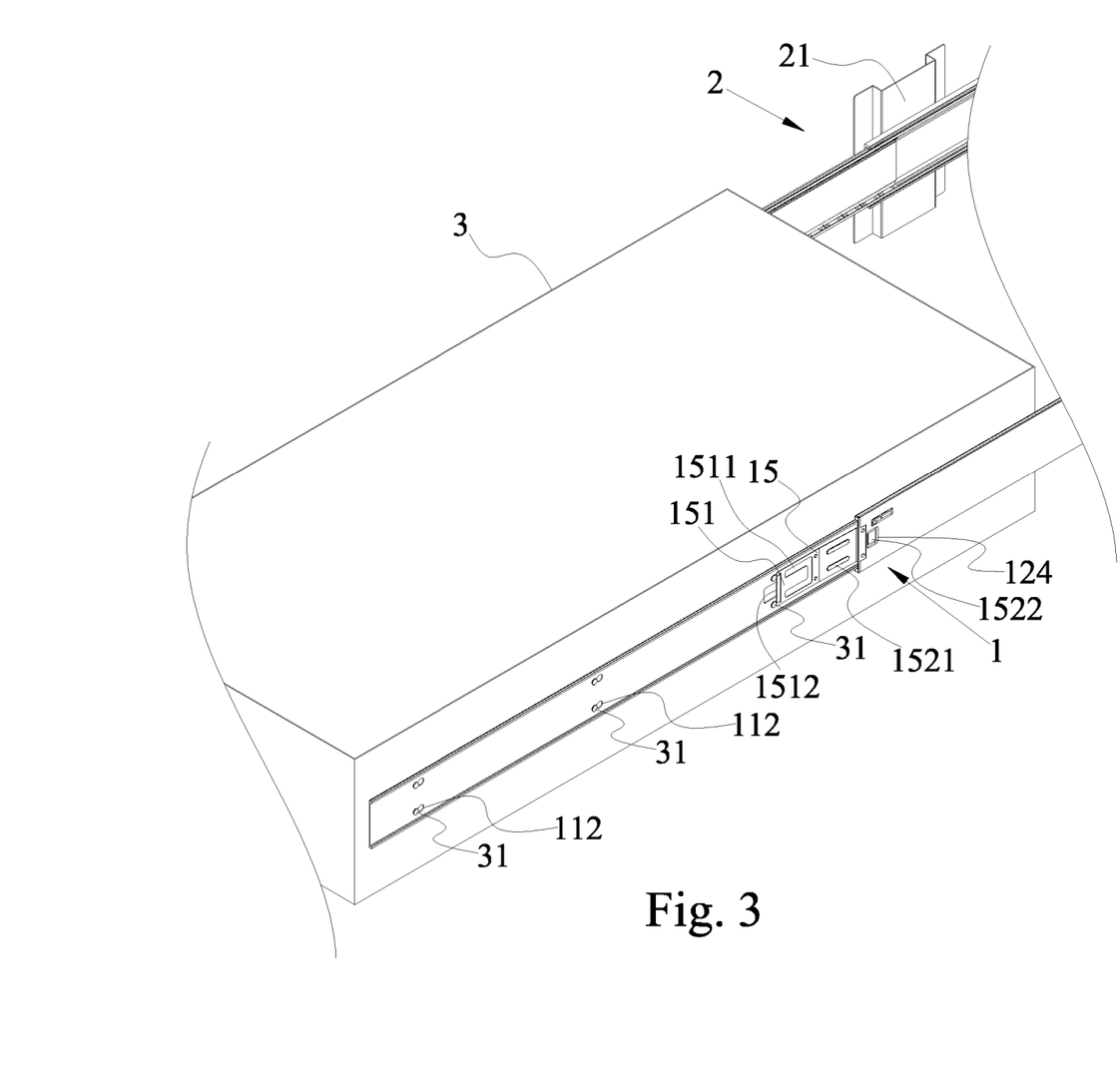
FIG. 3 is a partial blowup view of a preferred embodiment of the present disclosure.
Figure 4:
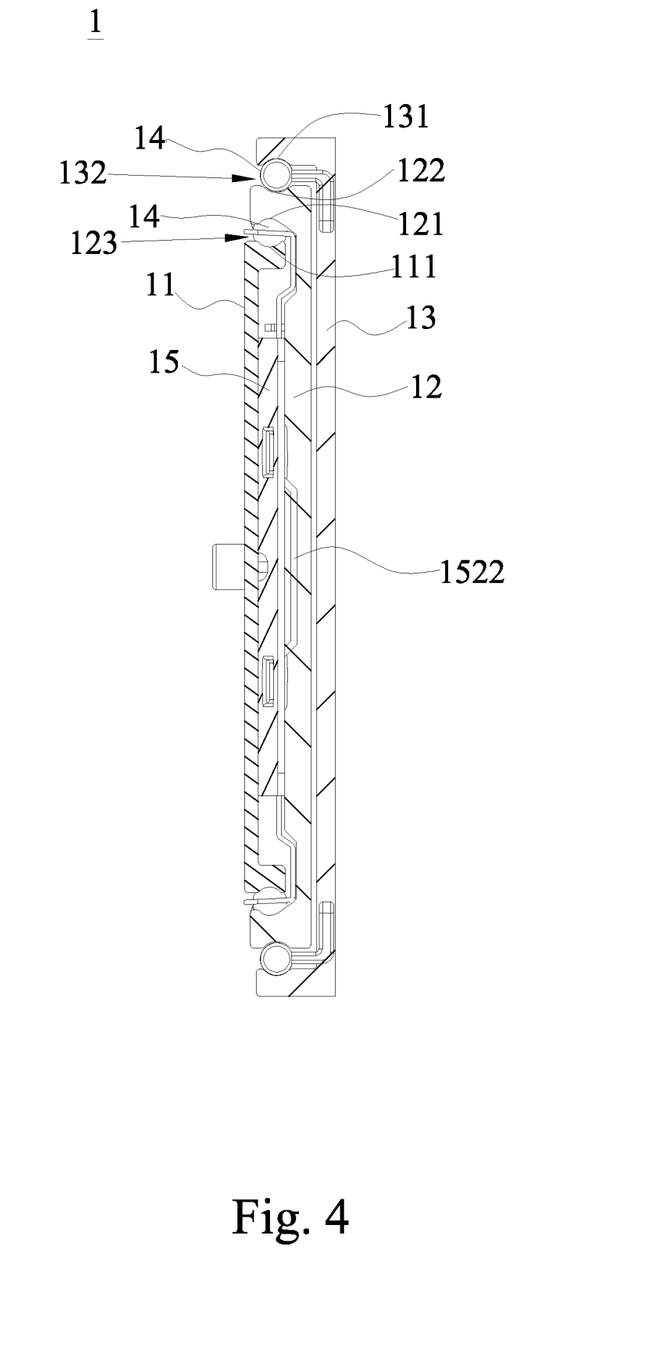
FIG. 4 is a cross-sectional view of a preferred embodiment of the present disclosure during assembling.

The central part of the elastic locking plate 15 is fixed onto the inner rail 11, two ends of the elastic locking plate 15 are provided with a first locking part 151 and a second locking part 152 respectively, the first locking part 151 is flatly installed and configured to be corresponsive to the first operating hole 113, such that the first locking part 151 can be locked at a position of the fixed columns 31 that pass out from the pair of fixing holes 112 on the sides of the first operating hole 151 in order to fix the server 3 onto the inner rail 11, and the second locking part 152 is tilted at a position corresponding to the second operating hole 124, such that the second locking part 152 can be passed out from the second operating hole 124 to form a linkage between the inner rail 11 and the middle rail 12. It is noteworthy that the first locking part 151 of the elastic locking plate 15 is horizontally formed with a U-shaped notch 1511, its adjacent edge is provided with a reinforcement part 1512, a surface of the second locking part 152 is provided with a pair of reinforcement ribs 1521, and its adjacent edge is provided with a pressing part 1522 protruded from the edge and configured to be corresponsive to the second operating hole 124, such that the pressing part 1522 can be accommodated in the second operating hole 124.

It is noteworthy that the width between the two brackets 21 is 450 mm, the width of the server 3 is 438 mm, and the remaining gap after deduction is 12 mm provided for installing the two aluminum extruded server slide rails 1, so that the thickness of each inner rail 11 plus each middle rail 12 on one side is 6 mm, the thickness of the inner rail 11 is 1.2 mm, the stock thickness of the central part of the middle rail 12 is 2.5 mm, and the stock thickness of the bilateral part is 1.5 mm. Alternatively, the width between the two brackets 21 is 450 mm, the width of the server 3 is 438.4 mm, and the remaining gap after deduction is 11.6 mm provided for installing the two aluminum extruded server slide rails 1, so that the thickness of each inner rail 11 plus each middle rail 12 on one side is 5.8 mm, the thickness of the inner rail 11 is 1.2 mm, the stock thickness of the central part of the middle rail 12 is 2.3 mm, and the stock thickness of the bilateral part is 1.3 mm.

Figure 5:
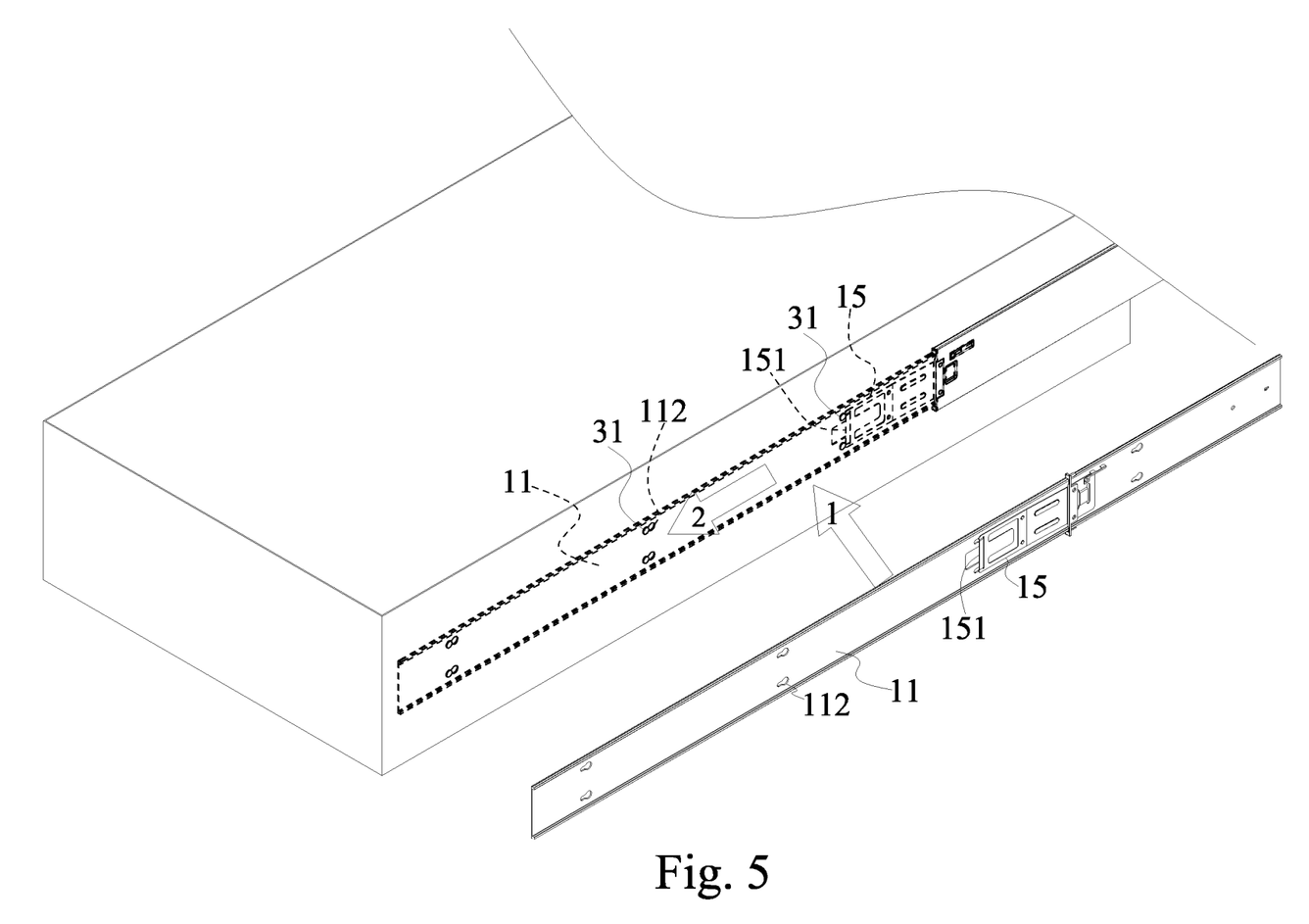
FIG. 5 is a schematic view showing the status of a preferred embodiment of the present disclosure during installation.
Figure 6:
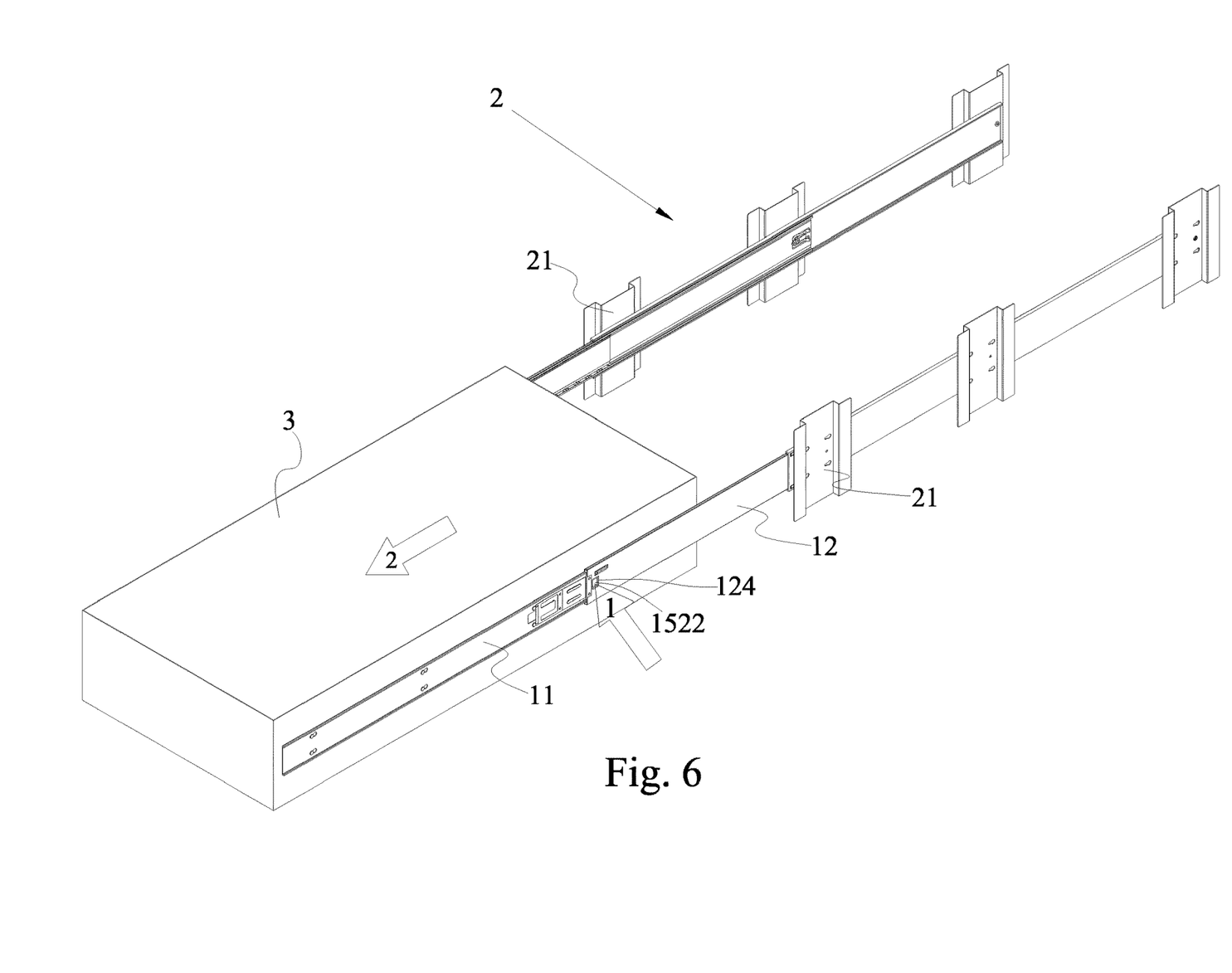
FIG. 6 is a schematic view showing the status of a preferred embodiment of the present disclosure during pulling operation.
Figure 7:
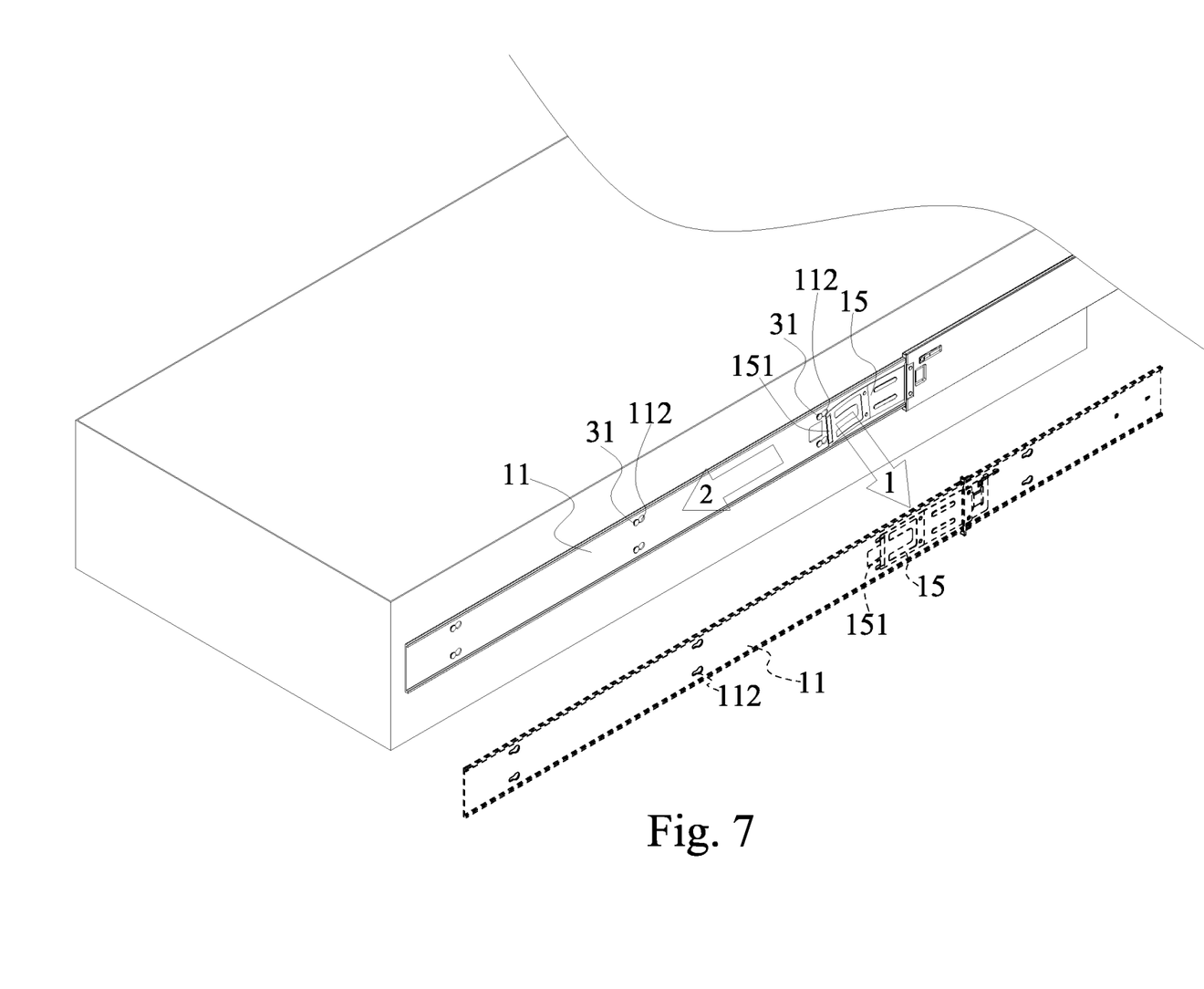
FIG. 7 is a schematic view showing the status of a preferred embodiment of the present disclosure during disassembling.

In summation of the description above, during the installation of the present disclosure, the server 3 is pushed from the back to the front in the outward pulling direction defined by the inner rail 11 in order to pass the fixed columns 31 on the side into each release part 1121, and push at the fixed parts 1122 to form a fixation, and then an edge of the first locking part 151 of the elastic locking plate 15 is provided for stopping the head end part of one of the pairs of fixed columns 31 to lock the server 3 to a position on the inner rail 11. On the other hand, when it is necessary to remove the server 3, the user puts a finger into the first operating hole 113 and turns the first locking part 151 of the elastic locking plate 15 outward. After the pair of fixed columns 31 is released, the server 3 is pushed in an opposite direction to pass the fixed columns 31 through the release parts 1121 and allow the user to remove the server, so as to achieve the effects of controlling the installation dimensions for the chassis width of the corresponding two specifications of 438.0 mm or 438.4 mm, and providing a more convenient and quicker operation.

What is claimed is:

1. An aluminum extruded server slide rail, installed in a server cabinet, and coupled to two sides of a server, for a stretching operation or a retracting operation, wherein an interior of the server cabinet is provided with four vertical brackets, and two sides of the server are provided with a plurality of fixed columns, the aluminum extruded server slide rail comprising:

an inner rail, being a long strip structure manufactured by an aluminum extrusion process, and having a cross-sectional view in a c-shape, and upper and lower edges of the inner rail being formed with a first groove, a planar area of the inner rail being provided with a plurality of fixing holes corresponding to the plurality of fixed columns respectively, a rear section of the planar area of the inner rail being provided with a first operating hole configured to be corresponsive to a pair of fixing holes among the plurality of fixing holes;

a middle rail, being a long strip structure manufactured by the aluminum extrusion process, and having a cross-sectional view in a c-shape, and an interior of upper and lower edges of the middle rail being formed with a second groove, and an exterior of the upper and lower edges of the middle rail being formed with a third groove, the inner rail being spaced inside the middle rail, such that a first sliding assistance space is defined between the first groove and the second groove, a central part of the middle rail having a stock thickness greater than a stock thickness of a bilateral part, wherein the stock thickness of the central part cannot exceed two times of the stock thickness of the bilateral part, and a front section of a planar area of the middle rail being provided with a second operating hole;

an outer rail, being a long strip structure manufactured by the aluminum extrusion process, and having a cross-sectional view in a c-shape, and an interior of upper and lower edges of the outer rail being formed with a fourth groove, and the middle rail being spaced inside the outer rail, such that a second sliding assistance space is defined between the third groove and the fourth groove;

a plurality of sliding assistance parts, disposed in the first sliding assistance space and the second sliding assistance space respectively, such that the inner rail is slidable and telescope-able relative to the middle rail, and the middle rail is slidable and telescope-able relative to the outer rail; and an elastic locking plate, with a central part fixed onto the inner rail, and two ends of the elastic locking plate being provided with a first locking part and a second locking part respectively, the first locking part being flatly installed and configured to be corresponsive to the first operating hole, such that the first locking part is locked at a position of the plurality of fixed columns that extend out from the pair of fixing holes on sides of the first operating hole, so as to fix the server onto the inner rail, the second locking part being tilted at a position corresponding to the second operating hole, and the second locking part being extended out from the second operating hole to form a linkage between the inner rail and the middle rail.

2. The aluminum extruded server slide rail according to claim 1, wherein the plurality of fixing holes is configured in pairs and spaced from each other, and each pair of fixing holes is disposed at a front section, a middle section, and the rear section of the inner rail respectively.

3. The aluminum extruded server slide rail according to claim 2, wherein each of the plurality of fixing holes is in an ∞ shape, and has an end with a size greater than a size of a head end of any one of the plurality of fixed columns to form a release part and another end with a size smaller than the size of the head end of any one of the plurality of fixed columns to form a fixed part, and the fixed part is disposed in a direction towards an outward pulling direction defined by the inner rail.

4. The aluminum extruded server slide rail according to claim 3, wherein the server is pushed from rear to front in the outward pulling direction defined by the inner rail in order to insert the plurality of fixed columns on the two sides into each of the release parts and push at the fixed parts to form a fixation, and an edge of the first locking part of the elastic locking plate is provided for stopping the head end of the pair of fixed columns to lock the server to a position on the inner rail.

5. The aluminum extruded server slide rail according to claim 4, wherein when the server is to be removed, a user puts a finger into the first operating hole and turns the first locking part of the elastic locking plate outward, and after the pair of fixed columns is released, the server is pushed in an opposite direction to move the plurality of fixed columns through the release parts to allow the user to remove the server.

6. The aluminum extruded server slide rail according to claim 1, wherein two of the four vertical brackets have a width of 450 mm therebetween, the server has a width of 438 mm, a remaining gap after a deduction between the a width of the two of the four vertical brackets and the width of the server is 12 mm and is provided for installing two aluminum extruded server slide rails, a thickness of each of the inner rail plus a thickness of each of the middle rail on one side is 6 mm, a thickness of the inner rail is 1.2 mm, the stock thickness of the central part of the middle rail is 2.5 mm, and the stock thickness of the bilateral part is 1.5 mm.

7. The aluminum extruded server slide rail according to claim 1, wherein two of the four vertical brackets have a width of 450 mm therebetween, and the server has a width of 438.4 mm, a remaining gap after a deduction between the a width of the two of the four vertical brackets and the width of the server is 11.6 mm and is provided for installing two aluminum extruded server slide rails, a thickness of each of the inner rail plus a thickness of each of the middle rail on one side is 5.8 mm, a thickness of the inner rail is 1.2 mm, the stock thickness of the central part of the middle rail is 2.3 mm, and the stock thickness of the bilateral part is 1.3 mm.

8. The aluminum extruded server slide rail according to claim 1, wherein the first locking part of the elastic locking plate is horizontally formed with a U-shaped notch, and an adjacent edge of the U-shaped notch is provided with a reinforcement part, and a surface of the second locking part is provided with a pair of reinforcement ribs, and an adjacent edge of each of the pair of reinforcement ribs is provided with a pressing part protruded therefrom and the pressing part is configured to be corresponsive to the second operating hole, so that the pressing part is accommodated in the second operating hole.

\* \* \* \* \*